(12) United States Patent
Kim et al.

(10) Patent No.: US 10,931,906 B2
(45) Date of Patent: Feb. 23, 2021

(54) SENSOR PIXEL OPERATING IN OPTICAL MODE AND CAPACITIVE MODE AND IMAGE SENSOR INCLUDING THE SAME

(71) Applicant: SILICON DISPLAY TECHNOLOGY, Yongin-si (KR)

(72) Inventors: Kijoong Kim, Suwon-si (KR); Jin Hyeong Yu, Incheon (KR); Young Man Park, Gwangju-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 7 days.

(21) Appl. No.: 16/379,018

(22) Filed: Apr. 9, 2019

(65) Prior Publication Data

US 2019/0327435 A1 Oct. 24, 2019

(30) Foreign Application Priority Data

Apr. 19, 2018 (KR) .................. 10-2018-0045641

(51) Int. Cl.
*H04N 5/374* (2011.01)
*G06K 9/00* (2006.01)
*H01L 27/146* (2006.01)
*H04N 5/378* (2011.01)

(52) U.S. Cl.
CPC ........... *H04N 5/374* (2013.01); *G06K 9/0004* (2013.01); *H01L 27/14609* (2013.01); *H01L 27/14612* (2013.01); *H01L 27/14636* (2013.01); *H01L 27/14678* (2013.01); *H04N 5/378* (2013.01)

(58) Field of Classification Search
CPC ........ H04N 5/374; H04N 5/378; H04N 5/369; G06K 9/0004; G06K 9/0002; H01L 27/14609; H01L 27/14612; H01L 27/14636; H01L 27/14678; H01L 27/14603; H01L 27/14665; G06F 3/042
See application file for complete search history.

(56) References Cited

U.S. PATENT DOCUMENTS

| 8,766,651 | B2 * | 7/2014 | Kang | .................... G06K 9/0002 |
| | | | | 324/662 |
| 2003/0090650 | A1 * | 5/2003 | Fujieda | ................. G06K 9/0004 |
| | | | | 356/71 |
| 2007/0024546 | A1 * | 2/2007 | Jang | ..................... G06K 9/0002 |
| | | | | 345/78 |
| 2008/0187189 | A1 * | 8/2008 | Shin | ..................... G06K 9/0002 |
| | | | | 382/124 |

(Continued)

FOREIGN PATENT DOCUMENTS

| JP | 2002-159052 | 5/2002 |
| JP | 5439114 | 3/2014 |

(Continued)

*Primary Examiner* — Patrick N Edouard
*Assistant Examiner* — Joseph P Fox
(74) *Attorney, Agent, or Firm* — Lex IP Meister, PLLC

(57) ABSTRACT

There is provided a sensor pixel, including: a first transistor controlled depending on a mode selection voltage supplied to one end thereof; a second transistor including a gate connected to the other end of the first transistor; and a photoconductor connected to one end of the second transistor, wherein the sensor pixel operates in an optical mode when the first transistor is turned on, and the sensor pixel operates in a capacitive mode when the first transistor is turned off.

14 Claims, 3 Drawing Sheets

(56) References Cited

U.S. PATENT DOCUMENTS

| | | | | |
|---|---|---|---|---|
| 2009/0267917 A1* | 10/2009 | Lee | ................... | G02F 1/13338 |
| | | | | 345/174 |
| 2016/0148036 A1* | 5/2016 | Kim | .................. | G06K 9/00046 |
| | | | | 382/124 |
| 2017/0316244 A1* | 11/2017 | Yang | ................. | H01L 27/14678 |
| 2019/0327435 A1* | 10/2019 | Kim | ........................ | G06F 3/042 |
| 2020/0035151 A1* | 1/2020 | Feng | .................... | G09G 3/3233 |

FOREIGN PATENT DOCUMENTS

| JP | 2016-009876 | 1/2016 |
|---|---|---|
| JP | 2017-005435 | 1/2017 |
| KR | 10-2009-0113127 | 10/2009 |
| KR | 10-1376228 | 4/2014 |
| KR | 10-1596377 | 2/2016 |

\* cited by examiner

SENSOR PIXEL OPERATING IN OPTICAL MODE AND CAPACITIVE MODE AND IMAGE SENSOR INCLUDING THE SAME

CROSS-REFERENCE TO RELATED APPLICATION

This application claims priority to and the benefit of Korean Patent Application No. 10-2018-0045641 filed in the Korean Intellectual Property Office on Apr. 19, 2018, the entire contents of which are incorporated herein by reference.

BACKGROUND OF THE INVENTION

(a) Field of the Invention

The present disclosure relates to a sensor pixel capable of recognizing a fingerprint and a document in an optical mode and a capacitive mode, and an image sensor including the same.

(b) Description of the Related Art

A conventional image sensor uses one specific manner among an optical manner, a capacitive manner, a resistive manner, a thermal sensing manner, an ultrasonic manner, and the like.

Since advantages and disadvantages of the image sensor differ depending on a manner of the image sensor, the image sensor using the specific manner is difficult to have the advantages of other manners.

The above information disclosed in this Background section is only for enhancement of understanding of the background of the invention and therefore it may contain information that does not form the prior art that is already known in this country to a person of ordinary skill in the art.

SUMMARY OF THE INVENTION

The present disclosure has been made in an effort to provide an image sensor having advantages of recognizing a fingerprint and a document by selecting one of an optical mode and a capacitive mode.

An exemplary embodiment of the present invention provides a sensor pixel, including: a first transistor controlled depending on a mode selection voltage supplied to one end thereof; a second transistor including a gate connected to the other end of the first transistor; and a photoconductor connected to one end of the second transistor, wherein the sensor pixel operates in an optical mode when the first transistor is turned on and operates in a capacitive mode when the first transistor is turned off.

The first transistor may be turned off and the photoconductor may be turned on when the mode selection voltage is a positive voltage of a first level. The first transistor may be turned on and the photoconductor may be turned off when the mode selection voltage is a negative voltage of a second level.

An off current of the photoconductor may change depending on light to be irradiated to the photoconductor, and a current flowing through the second transistor may change depending on the off current.

The sensor pixel may further include a coupling capacitor including one electrode connected to the gate of the second transistor and the other electrode to which a coupling pulse is applied. A negative voltage of the coupling pulse may be higher than the second level.

The sensor pixel may further include: a third transistor including a gate connected to the other end of the second transistor; a fourth transistor including one end connected to one end of the third transistor and the other end connected to a data line; a fifth transistor including one end connected to the other end of the first transistor and the other end to which a coupling pulse is applied; a sixth transistor including one end connected to the other end of the second transistor and the other end to which the coupling pulse is applied; a coupling capacitor including one electrode connected to the gate of the second transistor and the other electrode to which the coupling pulse is applied; a sensing electrode connected to the gate of the second transistor; and a storage capacitor including one electrode connected to the gate of the third transistor and the other electrode to which a driving voltage is applied. The fourth transistor may perform a switching operation by a current gate signal and the fifth transistor may perform a switching operation by a previous gate signal.

The sensing electrode may form a capacitor together with a fingerprint which is a recognition target when the first transistor is turned off.

Another exemplary embodiment of the present invention provides an image sensor, including: a sensor panel including a plurality of pixels, a plurality of gate lines connected to the plurality of pixels, a plurality of date lines, and a plurality of mode selection lines; a gate driving circuit supplying a plurality of gate signals corresponding to the plurality of gate lines; a sensor signal readout circuit receiving a plurality of data signals from the plurality of pixels through the plurality of date lines; and a mode selection unit supplying a mode selection voltage to the plurality of mode selection lines, wherein each of the plurality of pixels operates in one of a capacitive mode and an optical mode depending on the mode selection voltage.

Each of the plurality of pixels may include: a first transistor controlled depending on the mode selection voltage supplied to one end thereof; a second transistor including a gate connected to the other end of the first transistor; and a photoconductor connected to one end of the second transistor, and each of the plurality of pixels may operate in an optical mode when the first transistor is turned on, and may operate in a capacitive mode when the first transistor is turned off.

The first transistor may be turned off and the photoconductor may be turned on when the mode selection voltage is a positive voltage of a first level. The first transistor may be turned on and the photoconductor may be turned off when the mode selection voltage is a negative voltage of a second level.

An off current of the photoconductor may change depending on light to be irradiated to the photoconductor, and a current flowing through the second transistor may change depending on the off current.

Each of the plurality of pixels may further include a coupling capacitor including one electrode connected to the gate of the second transistor and the other electrode connected to a corresponding coupling pulse line, and the other end of the second transistor may be connected to the corresponding coupling pulse line, and when the mode selection voltage is a negative voltage of a second level, a negative voltage of the coupling pulse supplied to the corresponding coupling pulse line may be higher than the second level Each of the plurality of pixels may further include: a third transistor including a gate connected to the other end of the second transistor; a fourth transistor including one end connected to one end of the third transistor, the other end connected to a corresponding data line, and a gate connected to a corresponding gate line; a fifth transistor including one end connected to the other end of the first transistor, the other end connected to a corresponding coupling pulse line, and a gate connected to a previous gate line of the corresponding gate line; a sixth transistor including one end connected to the other end of the second transistor, the other end connected to the corresponding coupling pulse line, and a gate connected to the previous gate line; a coupling capacitor connected between the gate of the second transistor and the corresponding coupling pulse line; a sensing electrode connected to the gate of the second transistor; and a storage capacitor including one electrode connected to the gate of the third transistor and the other electrode to which a driving voltage is applied.

In each of the plurality of pixels, the sensing electrode may form a capacitor together with a fingerprint which is a recognition target when the first transistor is turned off.

According to an exemplary embodiment, a sensor pixel capable of recognizing a fingerprint and a document by selecting one of an optical mode and a capacitive mode, and an image sensor including the same may be provided.

DETAILED DESCRIPTION OF THE EMBODIMENTS

Figure 1:
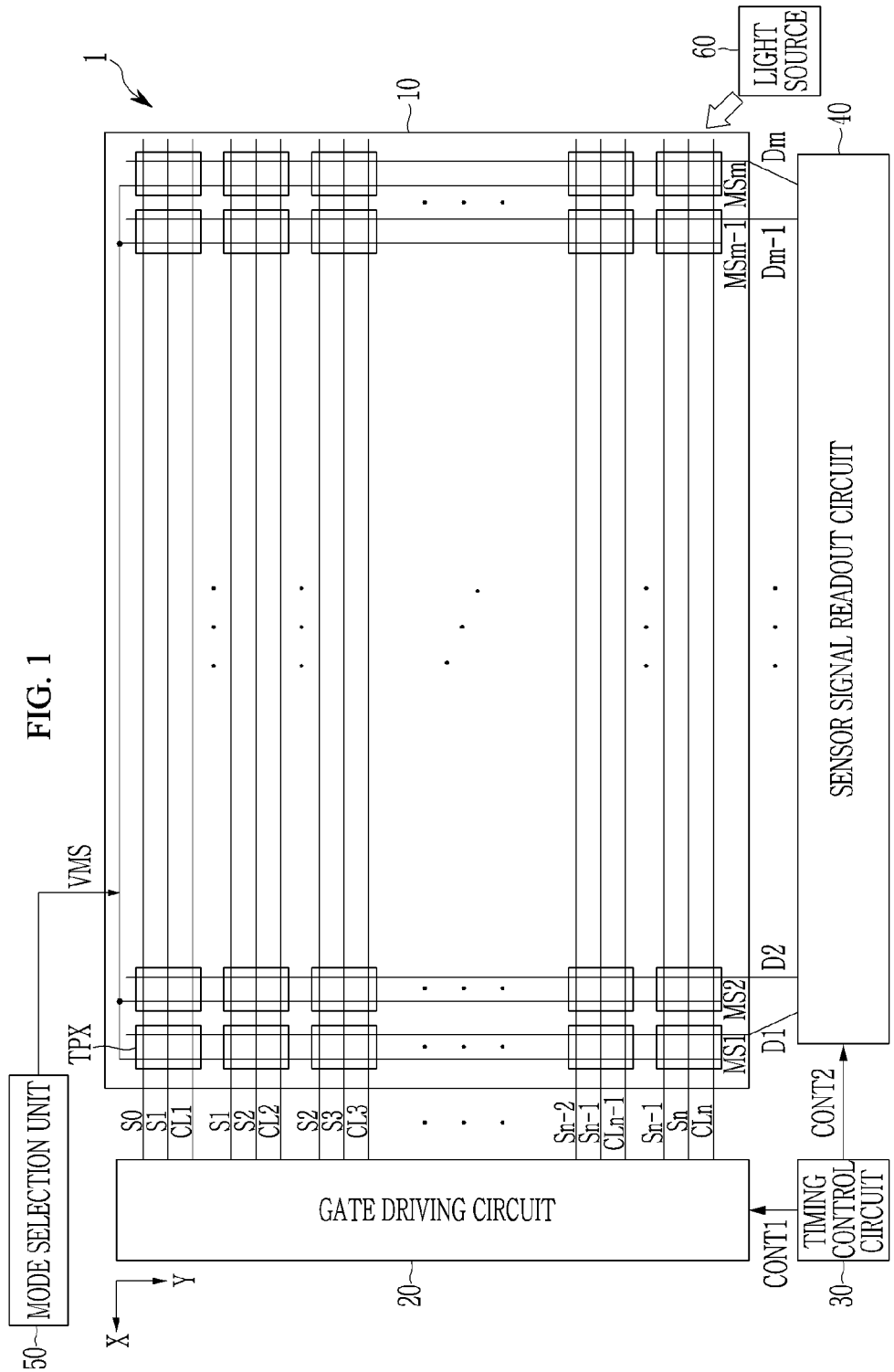
FIG. 1 is a diagram showing an image sensor according to an exemplary embodiment.

Hereinafter, exemplary embodiments of the present invention will be described in detail with reference to the accompanying drawings so that those skilled in the art to which the present invention pertains may easily implement the present invention. However, the present invention may be implemented in various different forms and is not limited to exemplary embodiments described herein. In addition, parts irrelevant to description are omitted in the drawings in order to clearly explain the present invention. The same elements are denoted by the same reference numerals throughout the specification.

A sensor pixel and an image sensor according to an exemplary embodiment may operate in any one of an optical mode and a capacitive mode depending on a mode selection voltage.

FIG. 1 is a diagram showing an image sensor according to an exemplary embodiment.

As described in FIG. 1, an image sensor 1 includes a sensor panel 10, a gate driving circuit 20, a timing control circuit 30, a sensor signal readout circuit 40, a mode selection unit 50, and a light source 60.

The light source 60 provides light required for sensing an optical fingerprint and character. The light source 60 may be positioned on a rear surface of the sensor panel 10 and may provide light to a front surface of the sensor panel 10.

The mode selection unit 50 supplies a mode selection voltage VMS to the sensor panel 10.

The sensor panel 10 includes a plurality of gate lines S0 to Sn, a plurality of data lines D1 to Dm, a plurality of coupling pulse lines CL1 to CLn, a plurality of mode selection lines MS1 to MSm, and a plurality of sensor pixels TPXs.

The plurality of gate lines S0 to Sn extend in a first direction (an X-direction in FIG. 1) and are arranged in a second direction (a Y-direction in FIG. 1) intersecting with the first direction. A gate signal corresponding to each of a plurality of sensor pixel rows is transmitted to each of the plurality of sensor pixel rows through each of the plurality of gate lines S0 to Sn.

It is shown in FIG. 1 that two gate lines correspond to each of the sensor pixel rows. This is because each of the sensor pixels operates depending on the corresponding two gate signals. However, the present invention is not limited thereto, and the number of gate lines connected to one sensor pixel may vary depending on a gate signal required for an operation of the sensor pixel.

The plurality of coupling pulse lines CL1 to CLn extend in the first direction and are arranged in the second direction intersecting with the first direction. A coupling pulse corresponding to each of the plurality of sensor pixel rows is transmitted to each of the plurality of sensor pixel rows through each of the plurality of coupling pulse lines CL1 to CLn. The coupling pulse is a pulse signal for continuously performing coupling in the sensor pixel in a capacitive manner.

The plurality of data lines D1 to Dm extend in the second direction and are arranged in the first direction. A data signal of each of the plurality of sensor pixels is transmitted to the sensor signal readout circuit 40 through each of the plurality of data lines D1 to Dm.

The plurality of mode selection lines MS1 to MSm extend in the second direction and are arranged in the first direction. The mode selection voltage is supplied to the plurality of sensor pixels TPXs through each of the plurality of mode selection lines MS1 to MSm.

Each of the plurality of sensor pixels TPXs is connected to the corresponding two gate lines, data line, coupling pulse line, and mode selection line. Each of the plurality of sensor pixels TPXs is reset in synchronization with the gate signal transmitted through one of the corresponding two gate lines. In each of the plurality of sensor pixels TPXs, a capacitance is coupled depending on a coupling pulse transmitted through the corresponding coupling pulse line and a data signal may be transmitted to the corresponding data line in synchronization with the gate signal transmitted through the other one of the corresponding two gate lines. Each of the plurality of sensor pixels TPXs operates in one manner of an optical manner and a capacitive manner depending on the mode selection voltage transmitted through the mode selection line.

The gate driving circuit 20 generates a plurality of gate signals and a plurality of coupling pulses and transmits the plurality of gate signals and the plurality of coupling pulses to the plurality of gate lines S0 to Sn and the plurality of coupling pulse lines CL1 to CLn. The gate driving circuit 20 generates the plurality of coupling pulses synchronized with the plurality of gate signals, respectively, and may transmit the plurality of coupling pulses to the plurality of coupling pulse lines CL1 to CLn.

The sensor signal readout circuit 40 receives a plurality of data signals transmitted through the plurality of data lines D1 to Dm and may create information on a fingerprint or a character sensed depending on the plurality of data signals.

The timing control circuit 30 may generate control signals CONT1 and CONT2 required for controlling operations of the gate driving circuit 20 and the sensor signal readout circuit 40.

The gate driving circuit 20 may generate a plurality of gate signals and a plurality of coupling pulses synchronized with the plurality of gate signals according to the control signal CONT1, respectively. The sensor signal readout circuit 40 receives the plurality of data signals at a point in time at which the plurality of data signals are transmitted through the plurality of data lines D1 to Dm according to the control signal CONT2 and may perform a signal processing required for creating information on the recognized fingerprint or character.

Figure 2:
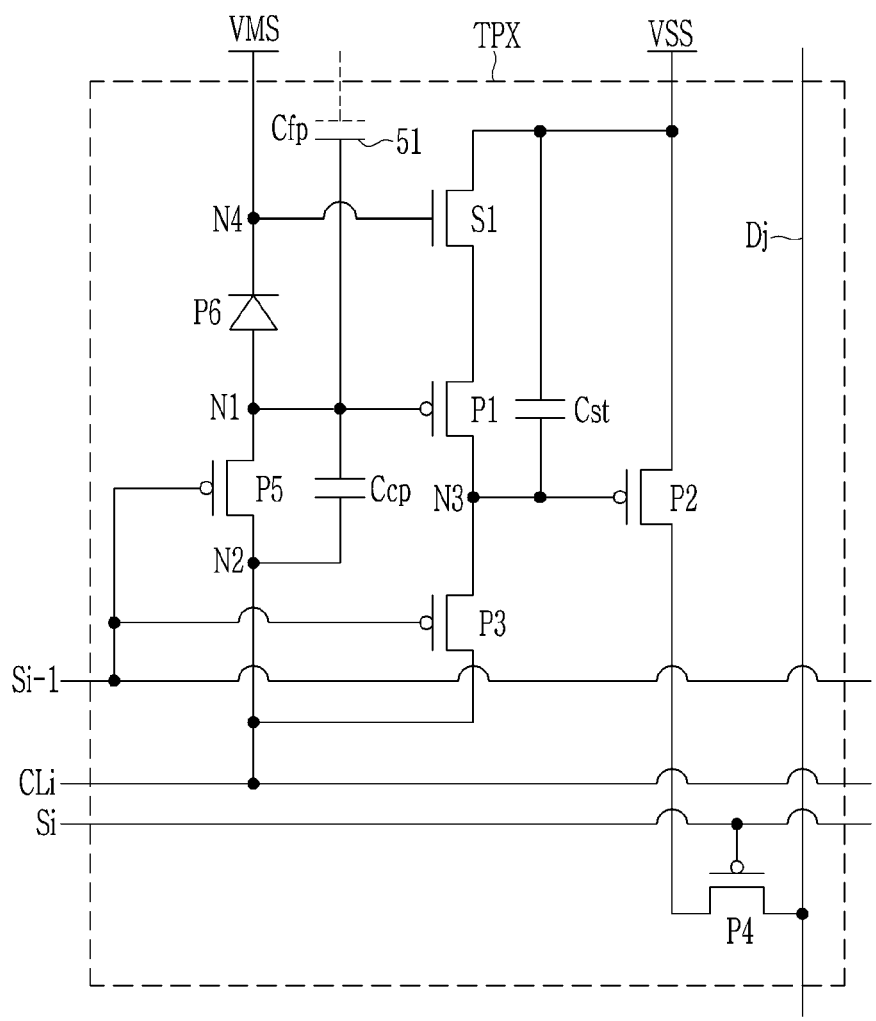
FIG. 2 is a diagram a showing a sensor pixel according to an exemplary embodiment.

FIG. 2 is a diagram showing a sensor pixel according to an exemplary embodiment.

The sensor pixel TPX positioned at an i-th row and a j-th column is shown in FIG. 2. The sensor pixel TPX positioned at another position includes the same components as shown in FIG. 2 and the respective components may be connected to each other as shown in FIG. 2.

The sensor pixel TPX includes six transistors P1 to P6, a coupling capacitor Ccp, a storage capacitor Cst, a photoconductor S1, and a fingerprint sensing electrode 51.

The fingerprint sensing electrode 51 is an electrode for sensing a corresponding position in a fingerprint or a character which is a recognition target. A fingerprint capacitor Cfp is formed on the fingerprint sensing electrode 51 at the time of contacting of a fingerprint.

A gate of the transistor P1 is connected to a node N1, one end of the transistor P1 is connected to one end of the photoconductor S1, and the other end of the transistor P1 is connected to a node N3. A driving voltage VSS is supplied to the other end of the photoconductor S1 and a gate of the photoconductor S1 is connected to a node N4. A mode selection voltage VMS is supplied to the node N4.

A gate of the transistor P2 is connected to the node N3, the driving voltage VSS is supplied to one end of the transistor P2, and the other end of the transistor P2 is connected to one end of the transistor P4. A gate of the transistor P3 is connected to a gate line Si-1 and both ends thereof are connected between the node N3 and the node N2. A gate of the transistor P4 is connected to a gate line Si and the other end of the transistor P4 is connected to a data line Dj. A gate of the transistor P5 is connected to the gate line Si-1 and is connected between the node N1 and the node N2. The fingerprint sensing electrode 51 is connected to the node N1, the coupling capacitor Ccp is connected between the node N1 and the node N2, one electrode of the storage capacitor Cst is connected to the node N3, and the driving voltage VSS is supplied to the other electrode of the storage capacitor Cst.

The transistor P6 may be diode connected, the mode selection voltage VMS is supplied to one end (cathode) of the transistor P6, and the other end (anode) of the transistor P6 is connected to the node N1. The sensor pixel TPX operates in the capacitive mode when the transistor P6 is turned off by the mode selection voltage VMS of a first level. The sensor pixel TPX operates in the optical mode when the transistor P6 is turned on by the mode selection voltage VMS of a second level. The first level is a level which may turn off the transistor P6 with a positive voltage and the second level is a level which may turn on the transistor P6 with a negative voltage.

Hereinafter, an operation of the image sensor according to an exemplary embodiment will be described with reference to FIG. 3.

Figure 3:
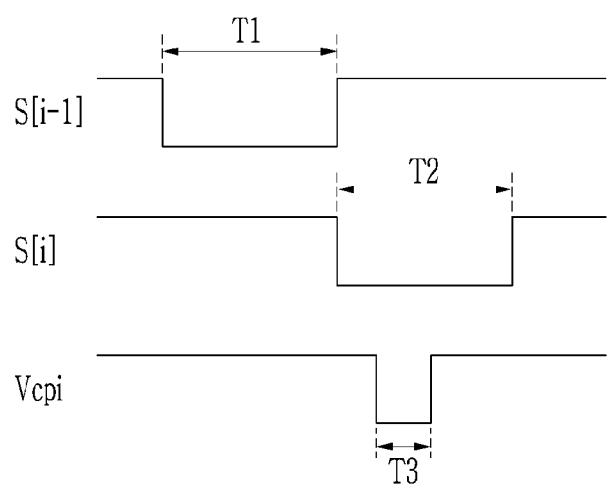
FIG. 3 is a waveform diagram showing a gate signal and a coupling pulse according to an exemplary embodiment.

FIG. 3 is a waveform diagram showing a gate signal and a coupling pulse according to an exemplary embodiment. The waveform shown in FIG. 3 is an example for describing an exemplary embodiment, but the present invention is not limited thereto.

First, a case where the transistor P6 is turned off by the mode selection voltage VMS of the first level and the photoconductor S1 is turned on, such that the sensor pixel TPX operates in the capacitive mode will be described.

The transistor P5 and the transistor P3 are turned on during a period T1 in which a previous gate signal S[i-1] is in a turn-on level, such that the gate of the transistor P1 and the gate of the transistor P2 are reset by a high level of a coupling pulse Vcpi. The coupling pulse Vcpi according to an exemplary embodiment becomes a turn-on level (for example, a low level) during a predetermined period T3 in synchronization with a turn-on period (for example, T2) of the corresponding gate signal (for example, the gate signal transmitted through the gate line Sn) during a period of one frame. The period T3 in which the coupling pulse is in the turn-on level may be shorter than the period T2 in which the corresponding gate signal is in the turn-on level.

The node N1 is coupled with a coupling pulse line CLi through the coupling capacitor Ccp. When the coupling pulse falls to a turn-on level at the period T3, a voltage reduction of the coupling pulse is distributed by two capacitors Cfp and Ccp, such that a voltage of the node N1 is reduced.

Since the mode selection voltage VMS is the first level, the photoconductor S1 is turned on and a current of the transistor P1 is controlled depending on a voltage. That is, the voltage of the node N1 is controlled depending on a fingerprint, the current of the transistor P1 is controlled depending on the voltage of the node N1, such that the fingerprint may be recognized.

The storage capacitor Cst may maintain a gate voltage of the transistor P2 determined depending on a current flowing through the transistor P1 or a voltage output through the transistor P1.

The transistor P4 is turned on by a corresponding gate signal (for example, a gate signal transmitted through the gate line Si, S[i]). Then, a current flowing through the transistor P2 is transmitted to the sensor signal readout circuit 40 through the data line Dj as a data signal.

A sensor pixel having another structure other than the sensor pixel shown in FIG. 2 may be applied to an exemplary embodiment. The case where the sensor pixel is implemented as a p-channel type transistor and a turn-on level is a low level, but the present invention is not limited thereto. The sensor pixel may be implemented as an n-channel type transistor, in this case, a turn-on level is a high level, and phases of a gate signal and a coupling signal may be opposite to those of the description described above.

Next, a case where the transistor P6 is turned on by the mode selection voltage VMS of the second level and the photoconductor S1 is turned off, such that the sensor pixel TPX operates in the optical mode will be described. The description overlapping with the description in the capacitive mode described above will be omitted.

Since the current flows through the transistor P6 by the mode selection voltage VMS of the second level, the mode selection voltage VMS of the second level is applied to the node Ni and the transistor P1 is turned on. The photoconductor S1 is turned off by the mode selection voltage VMS of the second level. At this time, in order to flow the current through the transistor P6, a negative voltage level of the coupling pulse is required to be higher than the second level.

In an exemplary embodiment, a current flowing through the photoconductor S1 in an off region changes depending on light to be irradiated to the photoconductor S1. That is, an off current flowing through the photoconductor S1 changes depending on light to be irradiated to the photoconductor S1, and a current flowing through the transistor P1 changes. Then, the current flowing through the photoconductor S1 changes depending on light to be irradiated to the sensor pixel TPX by reflecting light supplied from the light source 60 to the recognition target, and the current flowing through the transistor P1 changes depending on the current flowing through the photoconductor S1.

As an example, when recognizing a fingerprint, in a case of a ridge of the fingerprint, since the ridge of the fingerprint is in close contact with the sensor panel 10, an amount of light reflected from the light source 60 to the sensor pixel TPX is large, and in a case of a valley of the fingerprint, an amount of light reflected from the light source 60 to the sensor pixel TPX is relatively small due to a space between the valley of the fingerprint and the sensor panel 10. Accordingly, the off current flowing through the photoconductor S1 in the ridge of the fingerprint is larger than the off current flowing through the photoconductor S1 in the valley of the fingerprint. The voltage of the node N3 may decrease and the current flowing through the transistor P2 may increase as the current flowing through the photoconductor S1 is large.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

1: Image sensor
10: Sensor panel
20: Gate driving circuit
30: Timing control circuit
40: Sensor signal readout circuit
50: Mode selection unit
60: Light source

What is claimed is:

1. A sensor pixel, comprising:
a first transistor controlled depending on a mode selection voltage supplied to one end thereof;
a second transistor including a gate connected to the other end of the first transistor; and
a photoconductor directly connected to one end of the second transistor,
wherein the sensor pixel operates in an optical mode when the first transistor is turned on and operates in a capacitive mode when the first transistor is turned off.

2. The sensor pixel of claim 1, wherein:
the first transistor is turned off and the photoconductor is turned on when the mode selection voltage is a positive voltage of a first level.

3. The sensor pixel of claim 1, wherein:
the first transistor is turned on and the photoconductor is turned off when the mode selection voltage is a negative voltage of a second level.

4. The sensor pixel of claim 3, wherein:
an off current of the photoconductor changes depending on light to be irradiated to the photoconductor, and a current flowing through the second transistor changes depending on the off current.

5. The sensor pixel of claim 3, further comprising:
a coupling capacitor including one electrode connected to the gate of the second transistor and the other electrode to which a coupling pulse is applied.

6. The sensor pixel of claim 1, further comprising:
a third transistor including a gate connected to the other end of the second transistor;
a fourth transistor including one end connected to one end of the third transistor and the other end connected to a data line;
a fifth transistor including one end connected to the other end of the first transistor and the other end to which a coupling pulse is applied;
a sixth transistor including one end connected to the other end of the second transistor and the other end to which the coupling pulse is applied;
a coupling capacitor including one electrode connected to the gate of the second transistor and the other electrode to which the coupling pulse is applied;
a sensing electrode connected to the gate of the second transistor; and
a storage capacitor including one electrode connected to the gate of the third transistor and the other electrode to which a driving voltage is applied,
wherein the fourth transistor performs a switching operation by a current gate signal and the fifth transistor performs a switching operation by a previous gate signal.

7. The sensor pixel of claim 6, wherein:
the sensing electrode forms a capacitor together with a fingerprint which is a recognition target when the first transistor is turned off.

8. An image sensor, comprising:
a sensor panel including a plurality of pixels, a plurality of gate lines connected to the plurality of pixels, a plurality of data lines, and a plurality of mode selection lines;
a gate driving circuit supplying a plurality of gate signals corresponding to the plurality of gate lines; and
a sensor signal readout circuit receiving a plurality of data signals from the plurality of pixels through the plurality of data lines,
wherein:
each of the plurality of pixels includes:
a first transistor controlled depending on a mode selection voltage supplied to one end thereof through corresponding one of the plurality of mode selection lines;
a second transistor including a gate connected to the other end of the first transistor; and
a photoconductor directly connected to one end of the second transistor, and
each of the plurality of pixels operates in an optical mode when the first transistor is turned on, and operates in a capacitive mode when the first transistor is turned off.

9. The image sensor of claim 8, wherein:
the first transistor is turned off and the photoconductor is turned on when the mode selection voltage is a positive voltage of a first level.

10. The image sensor of claim 8, wherein:
the first transistor is turned on and the photoconductor is turned off when the mode selection voltage is a negative voltage of a second level.

11. The image sensor of claim 10, wherein:
an off current of the photoconductor changes depending on light to be irradiated to the photoconductor, and a current flowing through the second transistor changes depending on the off current.

12. The image sensor of claim 8, wherein:

each of the plurality of pixels further includes a coupling capacitor including one electrode connected to the gate of the second transistor and the other electrode connected to a corresponding coupling pulse line, and the other end of the second transistor is connected to the corresponding coupling pulse line, and when the mode selection voltage is a negative voltage of a second level.

13. The image sensor of claim 8, wherein:

each of the plurality of pixels further includes a third transistor including a gate connected to the other end of the second transistor;

a fourth transistor including one end connected to one end of the third transistor, the other end connected to a corresponding data line, and a gate connected to a corresponding gate line;

a fifth transistor including one end connected to the other end of the first transistor, the other end connected to a corresponding coupling pulse line, and a gate connected to a previous gate line of the corresponding gate line;

a sixth transistor including one end connected to the other end of the second transistor, the other end connected to the corresponding coupling pulse line, and a gate connected to the previous gate line;

a coupling capacitor connected between the gate of the second transistor and the corresponding coupling pulse line;

a sensing electrode connected to the gate of the second transistor; and a storage capacitor including one electrode connected to the gate of the third transistor and the other electrode to which a driving voltage is applied.

14. The image sensor of claim 13, wherein:

in each of the plurality of pixels, the sensing electrode forms a capacitor together with a fingerprint which is a recognition target when the first transistor is turned off.

* * * * *